US009179552B2

(12) United States Patent
Nishida et al.

(10) Patent No.: US 9,179,552 B2
(45) Date of Patent: Nov. 3, 2015

(54) WIRING BOARD

(71) Applicant: NGK SPARK PLUG CO., LTD., Nagoya, Aichi (JP)

(72) Inventors: Tomohiro Nishida, Mizuho (JP); Seiji Mori, Kounan (JP); Makoto Wakazono, Niwa-gun (JP)

(73) Assignee: NRK SPARK PLUG CO., LTD., Nagoya (JP)

( * ) Notice: Subject to any disclaimer, the term of this patent is extended or adjusted under 35 U.S.C. 154(b) by 44 days.

(21) Appl. No.: 14/235,729

(22) PCT Filed: Apr. 10, 2013

(86) PCT No.: PCT/JP2013/002424
§ 371 (c)(1),
(2) Date: Jan. 28, 2014

(87) PCT Pub. No.: WO2013/171965
PCT Pub. Date: Nov. 21, 2013

(65) Prior Publication Data
US 2014/0196939 A1 Jul. 17, 2014

(30) Foreign Application Priority Data

May 16, 2012 (JP) .................. 2012-112016

(51) Int. Cl.
*H05K 1/11* (2006.01)
*H05K 3/28* (2006.01)
(Continued)

(52) U.S. Cl.
CPC ............... *H05K 3/28* (2013.01); *H01L 21/563* (2013.01); *H05K 1/11* (2013.01); *H05K 3/3436* (2013.01);
(Continued)

(58) Field of Classification Search
CPC ............. H05K 1/00; H05K 1/02; H05K 1/03; H05K 1/09; H05K 1/11; H05K 1/14; H05K 1/16; H05K 1/18; H05K 3/00; H05K 3/10; H05K 3/30; H05K 7/02; H01L 23/00; H01L 23/48; H01L 23/52
USPC .......... 174/261, 251, 255, 260, 267; 257/670, 257/738, 774, 778, 784; 361/600; 29/846
See application file for complete search history.

(56) References Cited

U.S. PATENT DOCUMENTS
5,969,426 A * 10/1999 Baba et al. .................... 257/778
6,071,755 A * 6/2000 Baba et al. .................... 438/106
(Continued)

FOREIGN PATENT DOCUMENTS
JP 2002-33567 A 1/2002
JP 2004-179578 A 6/2004
(Continued)

OTHER PUBLICATIONS
JPO, International Search Report issued in corresponding international application No. PCT/JP2013/056707, mailed Apr. 23, 2013.
(Continued)

*Primary Examiner* — Xiaoliang Chen
(74) *Attorney, Agent, or Firm* — Stites & Harbison, PLLC; Jeffrey A. Haeberlin; James R. Hayne

(57) ABSTRACT

To obtain a wiring board that allows improving flowability of an underfill to be filled up a clearance between an electronic component and the wiring board. The present invention is a wiring board with a laminated body where one or more layer of each of an insulating layer and a conductor layer are laminated. The wiring board includes a plurality of connecting terminals formed separately from one another on the laminated body, a filling member filled up between the plurality of connecting terminals, and a solder resist layer laminated on the laminated body. The filling member is in contact with at least a part of each side surface of the plurality of connecting terminals. The solder resist layer includes an opening that exposes the plurality of connecting terminals. The filling member has a surface roughness rougher than a surface roughness of a top surface of the solder resist layer.

6 Claims, 13 Drawing Sheets

(a)

(b)

(51) Int. Cl.
*H01L 21/56* (2006.01)
*H05K 3/34* (2006.01)

(52) U.S. Cl.
CPC .... *H05K 3/3452* (2013.01); *H05K 2201/09881* (2013.01); *H05K 2201/10977* (2013.01); *H05K 2203/025* (2013.01); *H05K 2203/0783* (2013.01)

(56) References Cited

U.S. PATENT DOCUMENTS

| | | | |
|---|---|---|---|
| 6,525,275 B1* | 2/2003 | Asai | 174/255 |
| 6,831,234 B1* | 12/2004 | Asai et al. | 174/261 |
| 7,535,095 B1* | 5/2009 | En et al. | 257/701 |
| 7,916,492 B1* | 3/2011 | Zhong et al. | 361/760 |
| 8,003,897 B2* | 8/2011 | Kawamura et al. | 174/262 |
| 8,508,050 B2 | 8/2013 | Muramatsu et al. | |
| 2001/0052183 A1* | 12/2001 | Iba et al. | 29/846 |
| 2005/0258522 A1* | 11/2005 | En et al. | 257/670 |
| 2007/0086147 A1* | 4/2007 | Kawamura et al. | 361/600 |
| 2007/0096327 A1* | 5/2007 | Kawamura et al. | 257/774 |
| 2008/0041615 A1* | 2/2008 | Zhong et al. | 174/255 |
| 2008/0149369 A1* | 6/2008 | Kawamura et al. | 174/251 |
| 2008/0272502 A1* | 11/2008 | Nakasato et al. | 257/784 |
| 2008/0289176 A1* | 11/2008 | En et al. | 29/846 |
| 2008/0289864 A1* | 11/2008 | En et al. | 174/257 |
| 2008/0292852 A1* | 11/2008 | En et al. | 428/209 |
| 2009/0090003 A1* | 4/2009 | En et al. | 29/846 |
| 2009/0183904 A1* | 7/2009 | En et al. | 174/258 |
| 2009/0188708 A1* | 7/2009 | En et al. | 174/258 |
| 2009/0205857 A1* | 8/2009 | En et al. | 174/258 |
| 2009/0218122 A1 | 9/2009 | Fukase | |
| 2010/0044862 A1* | 2/2010 | Nalla et al. | 257/738 |
| 2010/0065323 A1* | 3/2010 | Kawamura et al. | 174/263 |
| 2010/0078786 A1 | 4/2010 | Maeda et al. | |
| 2010/0155129 A1* | 6/2010 | Kawamura et al. | 174/263 |
| 2010/0163288 A1* | 7/2010 | Zhong et al. | 174/258 |
| 2011/0042797 A1* | 2/2011 | Park et al. | 257/690 |
| 2011/0061232 A1* | 3/2011 | Kawamura et al. | 29/832 |
| 2011/0155438 A1* | 6/2011 | Ito et al. | 174/261 |
| 2011/0155443 A1* | 6/2011 | Maeda et al. | 174/267 |
| 2011/0177688 A1* | 7/2011 | Nakasato et al. | 438/667 |
| 2011/0214915 A1* | 9/2011 | Kawamura et al. | 174/264 |
| 2011/0308849 A1* | 12/2011 | Kondo et al. | 174/260 |
| 2011/0316170 A1 | 12/2011 | Muramatsu et al. | |
| 2012/0073862 A1* | 3/2012 | Muramatsu et al. | 174/251 |
| 2012/0153463 A1* | 6/2012 | Maeda | 257/737 |
| 2012/0241206 A1* | 9/2012 | Arai et al. | 174/260 |
| 2012/0285924 A1* | 11/2012 | Lee et al. | 216/13 |

FOREIGN PATENT DOCUMENTS

| | | |
|---|---|---|
| JP | 2006-332115 A | 12/2006 |
| JP | 2009-152317 A | 7/2009 |
| JP | 2009-212228 A | 9/2009 |
| JP | 2010-103516 A | 5/2010 |
| JP | 2012-9586 A | 1/2012 |
| JP | 2012-69629 A | 4/2012 |

OTHER PUBLICATIONS

JPO, Notification of Reason for Refusal, with concise notes in English, issued in corresponding JP application No. 2012-112016, dispatched Nov. 5, 2013.

* cited by examiner (a)

(b)

(a)

(b)

(a)

(b)

(a)

(b)

(a)

(b)

(c)

(d)

(e)

(a)

(b)

(a)

(b)

WIRING BOARD

TECHNICAL FIELD

The present invention relates to a wiring board that includes a plurality of connecting terminals on a principal surface for connecting to an electronic component.

BACKGROUND ART

Usually, a terminal for connection to a semiconductor chip (hereinafter referred to as a connecting terminal) is formed on a principal surface (front face) of a wiring board. Nowadays, the density of the connecting terminals has been becoming high, and therefore the distance (pitch) of the arranged connecting terminals has been narrow. In view of this, a wiring board employing a Non-Solder Mask Defined (NSMD) where a plurality of connecting terminals is disposed in the same opening of a solder resist has been proposed.

However, in the case where the plurality of connecting terminals are disposed in the same opening, a solder coated on the surface of the connecting terminal possibly flows out to an adjacent connecting terminals, resulting in a short circuit between the connecting terminals. Accordingly, to prevent the solder coated on the surface of the connecting terminal from flowing out to the adjacent connecting terminals, there is provided a wiring board with an insulating partition wall disposed between each of the connecting terminals (for example, see Patent Document 1).

However, with the partition wall, this partition wall prevents a flow of underfill to be filled up in a clearance between an electronic component and the wiring board when mounting the electronic component (for example, a semiconductor chip). In view of this, the underfill is not uniformly filled up in the clearance between the electronic component and the wiring board. This may cause a deficiency such as a breakage and corrosion.

Patent Document 1: JP-A-2009-212228

DISCLOSURE OF THE INVENTION

Problems to be Solved by the Invention

The present invention aims to obtain a wiring board that can improve flowability of underfill to be filled up in a clearance between an electronic component and the wiring board.

Solutions to the Problems

To achieve the above-described object, the present invention provides a wiring board with a laminated body where one or more layer of each of an insulating layer and a conductor layer are laminated. The wiring board includes a plurality of connecting terminals formed separately from one another on the laminated body, a filling member filled up between the plurality of connecting terminals, and a solder resist layer laminated on the laminated body. The filling member is in contact with at least a part of each side surface of the plurality of connecting terminals. The solder resist layer includes an opening that exposes the plurality of connecting terminals. The filling member has a surface roughness rougher than a surface roughness of a top surface of the solder resist layer.

According to the present invention, the surface roughness of the filling member filled up between the plurality of connecting terminals is rougher than a surface of the top surface of the solder resist layer. Thus, when connecting to the semiconductor chip, flowability of the underfill to be filled up in the clearance between the semiconductor chip and the wiring board improves. This prevents generating a void in the underfill between the connecting terminals. This also prevents the flow of the solder in the void during reflow of the solder and short circuit between the connecting terminals.

According to one aspect of the present invention, the filling member has a surface roughness (Ra) of 0.06 µm to 0.8 µm. Setting the surface roughness (Ra) of the filling member to 0.06 µm to 0.8 µm further improves the flowability of the underfill.

According to another aspect of the present invention, the solder resist layer has a surface roughness (Ra) of 0.02 µm to 0.25 µm. Setting the surface roughness (Ra) of the solder resist layer to 0.02 µm to 0.25 µm reduces the underfill to flow outside from the opening of the solder resist layer.

According to another aspect of the present invention, the solder resist layer includes the opening with an inner peripheral surface. The inner peripheral surface has a surface roughness rougher than a surface roughness of the top surface of the solder resist layer. Setting the surface roughness of the inner peripheral surface of the opening included in the solder resist layer rougher than a surface roughness of the top surface of the solder resist layer improves flowability of the underfill at the inner peripheral surface of the opening.

According to another aspect of the present invention, the filling member functions as a solder resist. The filling member that functions as the solder resist suppresses a solder from remaining on the filling member, thus suppressing a short circuit between the connecting terminals.

Furthermore, according to another aspect of the present invention, at least a part of the connecting terminal projects from a surface of the filling member. The connecting terminal projecting from the surface of the filling member facilitates connection to a counterpart terminal.

Effects of the Invention

As described above, according to the present invention, a wiring board that can improve flowability of underfill to be filled up in a clearance between an electronic component and the wiring board can be obtained.

DESCRIPTION OF EMBODIMENTS

Hereinafter, embodiments of the present invention will be described in detail with reference to the drawings. The following describes the embodiments of the present invention with an exemplary wiring board where a build-up layer is formed on a core substrate. However, the wiring board is only necessary to include a plurality of connecting terminals. The wiring board may be, for example, formed without a core substrate.

(First Embodiment)

Figure 1:
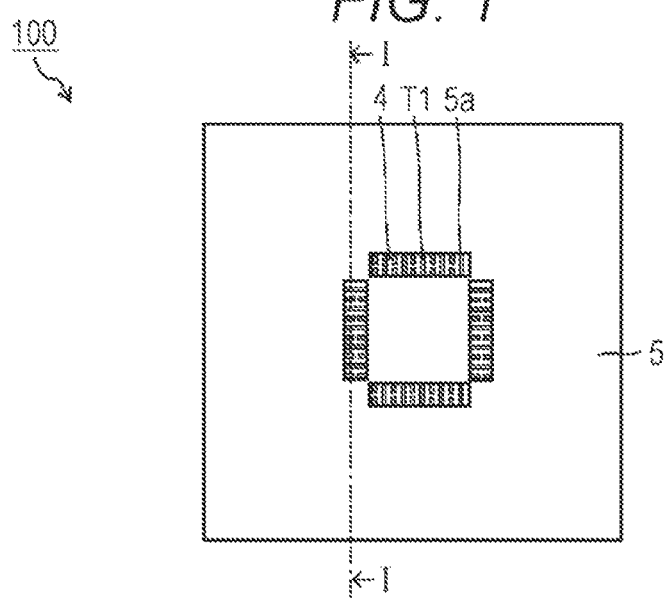
FIG. 1 is a top view (front face side) of a wiring board according to a first embodiment.
Figure 2:
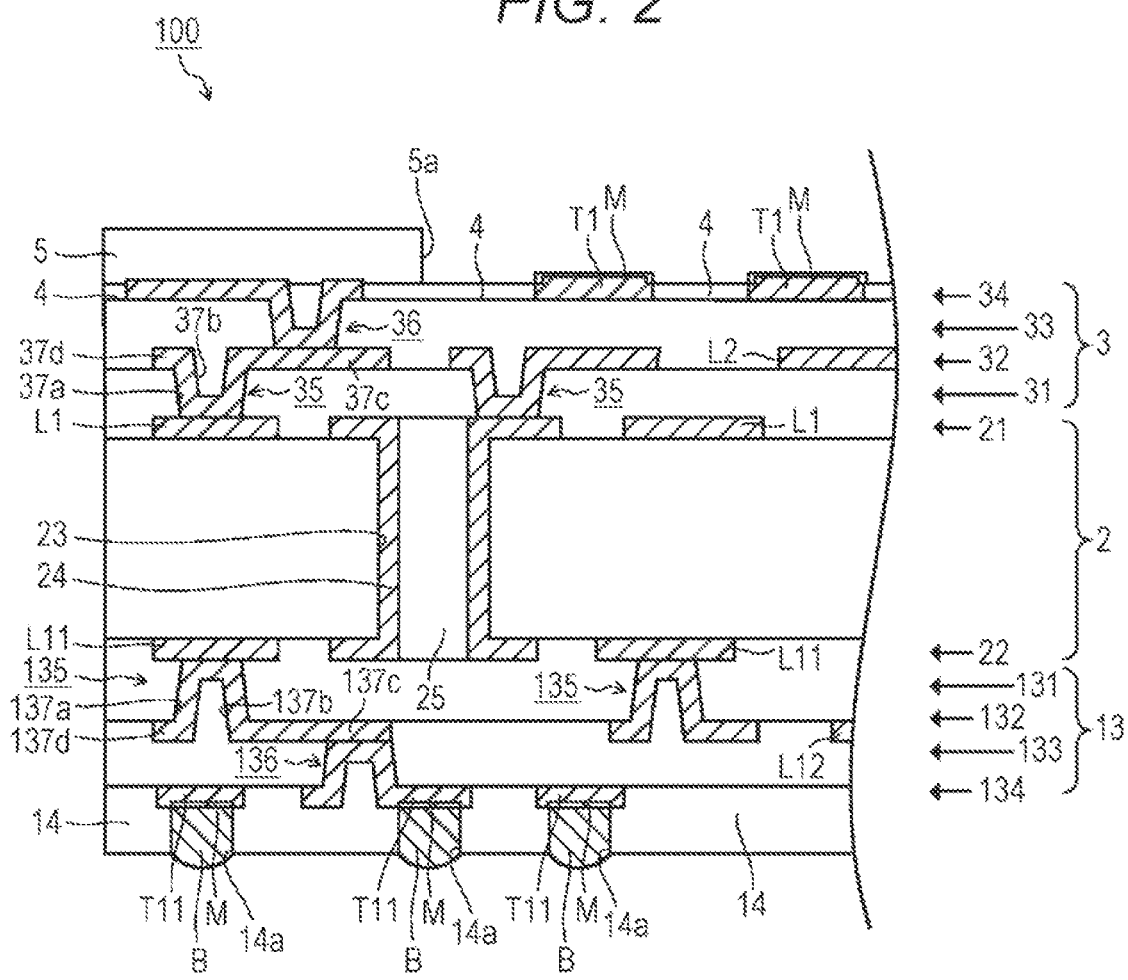
FIG. 2 is a partial sectional view of the wiring board according to the first embodiment.
Figure 3:
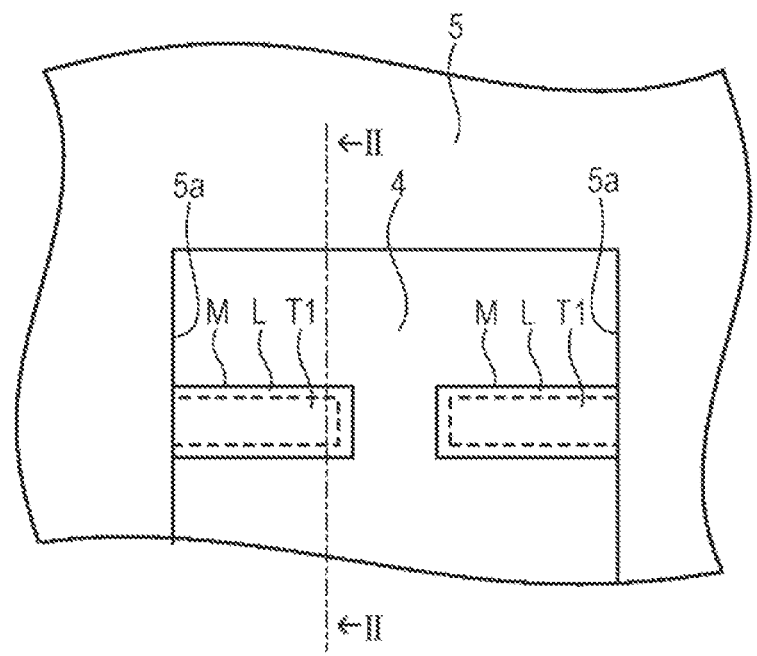
FIG. 3 is a configuration diagram of a connecting terminal on the front face side of the wiring board according to the first embodiment.
Figure 3:
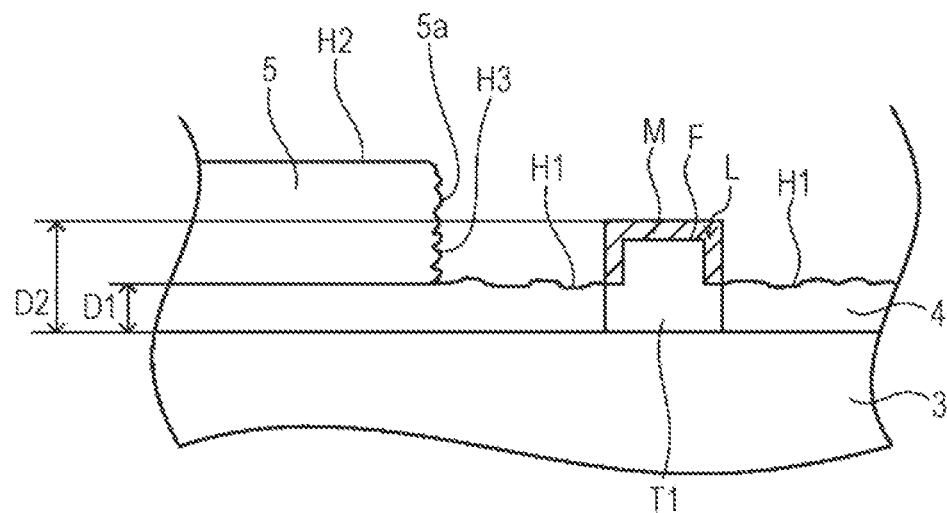

FIG. 1 is a top view (front face side) of a wiring board 100 according to a first embodiment. FIG. 2 is a partial sectional view of the wiring board 100 taken along the line I-I of FIG. 1. FIG. 3 is a configuration diagram of a connecting terminal T1 on the front face side of the wiring board 100. FIG. 3A is a top view of a connecting terminal T1. FIG. 3B is a sectional view taken along the line II-II of FIG. 3A. In the following description, a side to which a semiconductor chip is connected is referred to as a front face side while a side to which a motherboard, a socket, or a similar member (hereinafter referred to as a motherboard or a similar member) is connected is referred to as a reverse surface side.

(Configuration of Wiring Board 100)

The wiring board 100 illustrated in FIG. 1 to FIG. 3 includes a core substrate 2, a build-up layer 3 (front face side), a filling member 4, a solder resist layer 5, a build-up layer 13 (reverse surface side), and a solder resist layer 14. The build-up layer 3 includes the plurality of connecting terminals T1 for connection to a semiconductor chip (not shown). The build-up layer 3 is laminated on the front face side of the core substrate 2. The filling member 4 is laminated on the build-up layer 3. The filling member 4 fills up between the plurality of connecting terminals T1. The solder resist layer 5 is laminated on the filling member 4. The solder resist layer 5 includes an opening 5a to at least partially expose the connecting terminal T1. The build-up layer 13 includes a plurality of connecting terminals T11 for connection to a motherboard or a similar member (not shown). The build-up layer 13 is laminated on the reverse surface side of the core substrate 2. The solder resist layer 14 is laminated on the build-up layer 13. The solder resist layer 14 includes an opening 14a to at least partially expose the connecting terminal T11.

The core substrate 2 is a plate-shaped substrate made of resin. The core substrate 2 is constituted of a heat-resistant resin plate (for example, a bismaleimide-triazine resin plate), a fiber reinforced resin plate (for example, a glass fiber reinforced epoxy resin), or a similar plate. The core substrate 2 includes core conductor layers 21 and 22, which form metal lines L1 and L11 on the respective front face and reverse surface. The core substrate 2 includes a through-hole 23 drilled by, for example, drill. The through-hole 23 includes a through-hole conductor 24 at the inner wall surface. The through-hole conductor 24 conducts the core conductor layers 21 and 22 one another. Furthermore, the through-hole 23 is filled up with a resin plug 25 made of resin such as epoxy resin.

(Configuration at Front Face Side)

The build-up layer 3 includes resin insulating layers 31 and 33 and conductor layers 32 and 34 laminated on the front face side of the core substrate 2. The resin insulating layer 31 is made of thermosetting resin composition. A conductor layer 32 is formed on the surface of the resin insulating layer 31. The conductor layer 32 forms a metal line L2. A via 35 that electrically connects the core conductor layer 21 and conductor layer 32 is formed in the resin insulating layer 31. The resin insulating layer 33 is made of thermosetting resin composition. A conductor layer 34 is formed on the surface layer of the resin insulating layer 33. The conductor layer 34 includes the plurality of connecting terminals T1. A via 36 that electrically connects the conductor layer 32 and the conductor layer 34 is formed in the resin insulating layer. Here, the resin insulating layers 31 and 33 and the conductor layer 32 form a laminated body.

Vias 35 and 36 include a via hole 37a, a via conductor 37b, a via pad 37c, and a via land 37d. The via conductor 37b is disposed at the inner peripheral surface of the via hole 37a. The via pad 37c is disposed so as to be conducted with the via conductor 37b at the bottom surface side. The via land 37d is disposed on the opposite side of the via pad 37c. The via land 37d outwardly projects from the opening peripheral edge of the via conductor 37b.

The connecting terminal T1 is a connecting terminal for connection to the semiconductor chip. The connecting terminal T1 is a so-called peripheral connecting terminal disposed along the inner peripheral of the mounting region of the semiconductor chip. By electrical connection with the connecting terminal T1, the semiconductor chip is mounted on the wiring board 100. Each connecting terminal T1 has a rough surface to improve an adhesive property with the filling member 4, which will be described below.

Even if the surface of each connecting terminal T1 is not roughed, the adhesive property with the filling member 4 described below can be improved by the following processes. A metal element, any one of Tin (Sn), Titanium (Ti), Chrome (Cr), and Nickel (Ni) is coated on the surface of each connecting terminal T1 to form a metal layer. Then, a coupling agent process is performed on the metal layer. The coupling agent mainly serves to enhance the adhesive property of a metal and inorganic or an organic material such as a resin. The coupling agent includes, for example, a silane coupling agent, a titanate coupling agent, and an aluminate-based coupling agent. Use of the silane coupling agent is more preferable. The silane coupling agent includes, for example, aminosilane, epoxy silane, and styrene silane.

Each connecting terminal T1 includes a step L at an outer periphery of a first principal surface F. The first principal surface F is opposed to a contact surface with the resin insulating layer 33, which constitutes the build-up layer 3. The exposed surface of the connecting terminal T1 including the step L is covered with a metal plating layer M. When mounting the semiconductor chip to the wiring board 100, the connecting terminal of the semiconductor chip and the connecting terminal T1 are electrically connected by reflowing a solder coated on the connecting terminal of the semiconductor chip. The metal plating layer M is constituted of, for example, a single or a plurality of layers selected from metal layers such as a Ni layer, a Sn layer, an Ag layer, a Pd layer, and an Au layer (for example, Ni layer/Au layer and Ni layer/Pd layer/Au layer). Instead of the metal plating layer M, a rustproof Organic Solderability Preservative (OSP) process may be performed. A solder may be coated on the exposed surface of the connecting terminal T1 including the step L. Furthermore, after covering the exposed surface of the connecting terminal T1 including the step L with the metal plating layer M, the metal plating layer M may be coated with the solder. A method for coating the solder on the exposed surface of the connecting terminal T1 will be described later.

The filling member 4 is an insulating member laminated on the build-up layer 3. The material of the filling member 4 is preferred to be the same as a material of the solder resist layer 5. The filling member 4 is filled up between the connecting terminals T1 while contacting the side surface of each connecting terminal T1 formed on the surface layer of the build-up layer 3. The surface roughness of a surface H1 of the filling member 4 is rougher than a surface roughness of a top surface H2 (described below) of the solder resist layer 5. In view of this, when connecting the connecting terminal T1 and the semiconductor chip, flowability of the underfill filled up in the clearance between the semiconductor chip and the wiring board 100 improves. This prevents generation of a void in the underfill between the connecting terminals T1 and also prevents a short circuit between the connecting terminals T1 caused by flow of the solder to the void during reflowing the solder.

The surface roughness of the surface H1 of the filling member 4 is preferred to be a Ra (center line average roughness) of 0.06 μm to 0.8 μm or a Rz (ten-point average roughness) of 1.0 μm to 9.0 μm. Setting the surface roughness of the surface H1 of the filling member 4 to a Ra (center line average roughness) of 0.06 μm to 0.8 μm or a Rz (ten-point average roughness) of 1.0 μm to 9.0 μm further improves the flowability of the underfill filled up in the clearance between the semiconductor chip and the wiring board 100 when connecting the connecting terminal T1 to the semiconductor chip.

A thickness D1 of the filling member 4 is thinner than a thickness (height) D2 of the connecting terminal T1. That is, the connecting terminal T1 at least partially projects from the surface H1 of the filling member 4. Projecting the connecting terminal T1 from the surface H1 of the filling member 4 facilities connection with the terminal of the semiconductor chip.

The solder resist layer 5 covers the wiring pattern connected to the connecting terminal T1 and includes an opening 5a. The opening 5a exposes the connecting terminal T1 disposed along the inner peripheral of the mounting region of the semiconductor chip. The opening 5a of the solder resist layer 5 forms an NSMD shape where the plurality of connecting terminals T1 are disposed in the same opening. Here, the surface roughness of the top surface H2 of the solder resist layer 5 is equal to or less than a surface roughness of the surface H1 of the filling member 4. In view of this, the flowability of the underfill at the top surface H2 of the solder resist layer 5 is lower than a flowability of the underfill at the surface H1 of the filling member 4. This reduces a flow of the underfill from the opening 5a of the solder resist layer 5 to the outside.

The surface roughness of the top surface H2 of the solder resist layer 5 is preferred to be a Ra (center line average roughness) of 0.02 μm to 0.25 μm or a Rz (ten-point average roughness) of 0.6 μm to 5.0 μm. Setting the surface roughness of the top surface H2 of the solder resist layer 5 to a Ra (center line average roughness) of 0.02 μm to 0.25 μm or a Rz (ten-point average roughness) of 0.6 μm to 5.0 μm further reduces the underfill to flow outside from the opening 5a of the solder resist layer 5.

The opening 5a of the solder resist layer 5 includes an inner peripheral surface H3 with a surface roughness rougher than a surface roughness of the top surface H2 of the solder resist layer 5. Setting the surface roughness of the inner peripheral surface H3 of the opening 5a included in the solder resist layer 5 rougher than a surface roughness of the top surface H2 of the solder resist layer 5 improves flowability of the underfill at the inner peripheral surface H3 of the opening 5a. This efficiently prevents generation of a void that is caused by insufficient flow of the underfill between the surface H1 of the filling member 4 and the inner peripheral surface H3 of the opening 5a.

The surface roughness of the inner peripheral surface H3 of the opening 5a included in the solder resist layer 5 is preferred to be a Ra (center line average roughness) of 0.06 μm to 0.8 μm or a Rz (ten-point average roughness) of 1.0 μm to 9.0 μm. Setting the surface roughness of the inner peripheral surface H3 of the opening 5a included in the solder resist layer 5 to a Ra (center line average roughness) of 0.06 μm to 0.8 μm or a Rz (ten-point average roughness) of 1.0 μm to 9.0 μm further improves the flowability of the underfill at the inner peripheral surface H3 of the opening 5a. This efficiently prevents generation of a void that is caused by insufficient flow of the underfill between the surface H1 of the filling member 4 and the inner peripheral surface H3 of the opening 5a.

(Configuration of Reverse Surface Side)

The build-up layer 13 includes resin insulating layers 131 and 133 and conductor layers 132 and 134 laminated on the reverse surface side of the core substrate 2. The resin insulating layer 131 is made of thermosetting resin composition. The conductor layer 132 that includes a metal line L12 is formed on the reverse surface of the resin insulating layer 131. A via 135 that electrically connects the core conductor layer 22 and the conductor layer 132 is formed in the resin insulating layer 131. The resin insulating layer 133 is made of thermosetting resin composition. The conductor layer 134 that includes one or more connecting terminal T11 is formed on the surface layer of the resin insulating layer 132. A via 136 that electrically connects the conductor layer 132 and conductor layer 134 is formed in the resin insulating layer 133.

Vias 135 and 136 each include a via hole 137a, a via conductor 137b, a via pad 137c, and a via land 137d. The via conductor 137b is disposed at the inner peripheral surface of the via hole 137a. The via pad 137c is disposed so as to be conducted with the via conductor 137b on the bottom surface side. The via land 137d is disposed on the opposite side of the via pad 137c and outwardly projects from the opening peripheral edge of the via conductor 137b.

The connecting terminal T11 is used as a reverse surface land (PGA pad, BGA pad) to connect the wiring board 100 to a motherboard or a similar member. The connecting terminal T11 is formed at the outer peripheral region of the wiring board 100 excluding its approximate center portion and arranged in a rectangular shape so as to surround the approximate center portion. At least a part of the surface of the connecting terminal T11 is covered with the metal plating layer M.

The solder resist layer 14 is formed by laminating a film solder resist on the surface of the build-up layer 13. The solder resist layer 14 includes the opening 14a that partially exposes the surface of each connecting terminal T11. In view of this, the surface of each connecting terminal T11 is partially exposed from the solder resist layer 14 by the opening 14a. That is, the opening 14a of the solder resist layer 14 is formed to have an SMD shape where the surface of each connecting terminal T11 is partially exposed. Different from the opening 5a of the solder resist layer 5, the opening 14a of the solder resist layer 14 is formed at each connecting terminal T11.

A solder ball B made of a solder, such as Sn—Ag, Sn—Cu, Sn—Ag—Cu, and Sn—Sb that substantially does not contain Pb is formed in the opening 14a. The solder ball B is formed to electrically connect to the connecting terminal T11 via the metal plating layer M. When mounting the wiring board 100 on the motherboard or a similar member, reflowing the solder ball B on the wiring board 100 electrically connects the connecting terminal T11 to the connecting terminal of the motherboard or a similar member.

(Method for Fabricating Wiring Board)

FIG. 4 to FIG. 11 are process drawings for fabricating the wiring board 100 according to the first embodiment. The following describes methods for fabricating the wiring board 100 with reference to FIG. 4 to FIG. 11.

Figure 4:
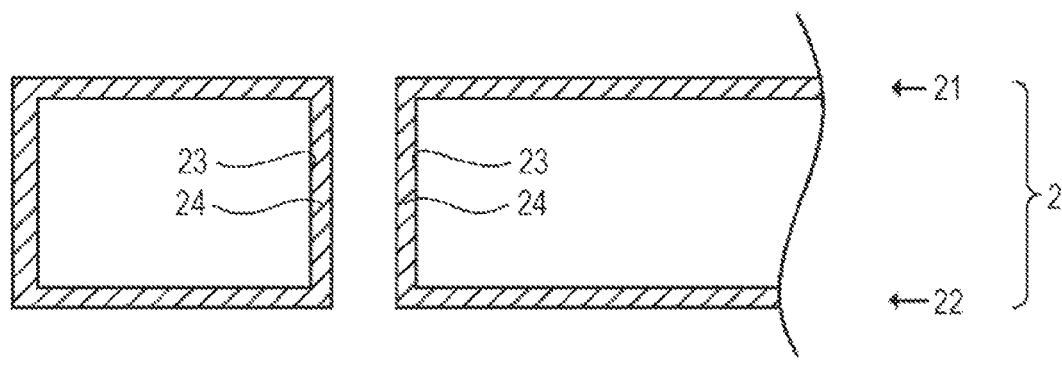
FIG. 4 is process drawing for fabricating the wiring board according to the first embodiment (core substrate process).
Figure 4:
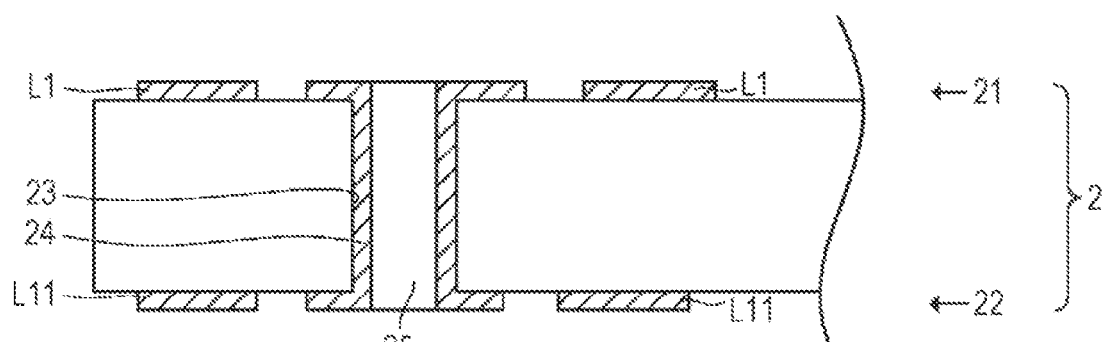

(Core Substrate Process: FIG. 4)

A copper-clad laminate, which includes a plate-shaped substrate made of resin to which copper foils are pasted on the front face and the reverse surface, is prepared. The copper-clad laminate is drilled with a drill to preliminarily form a penetration hole, which will be the through-hole 23, at a predetermined position. Then, the through-hole conductor 24 is formed at the inner wall of the through-hole 23 by performing electroless copper plating and electrolytic copper plating in accordance with a conventionally known method. Thus, copper plating layers are formed on both surfaces of the copper-clad laminate (see FIG. 4A).

Afterwards, the inside of the through-hole conductor 24 is filled up with the resin plug 25 such as epoxy resin. Furthermore, the copper plating formed on the copper foils of both surfaces of the copper-clad laminate is etched to a desired shape. Thus, the core conductor layers 21 and 22 forming the metal lines L1 and L11 on the respective front face and reverse surface of the copper-clad laminate are formed, obtaining the core substrate 2 (see FIG. 4B). After forming the through-hole 23, performing a desmear process, which removes a smear at a processed part, is preferred.

Figure 5:
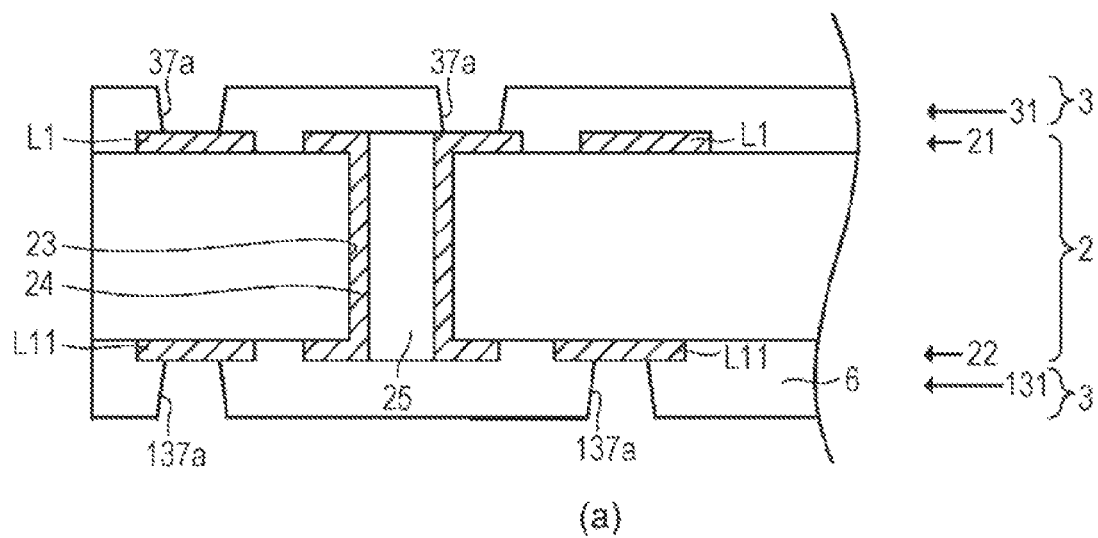
FIG. 5 is a process drawing for fabricating the wiring board according to the first embodiment (build-up process).
Figure 5:
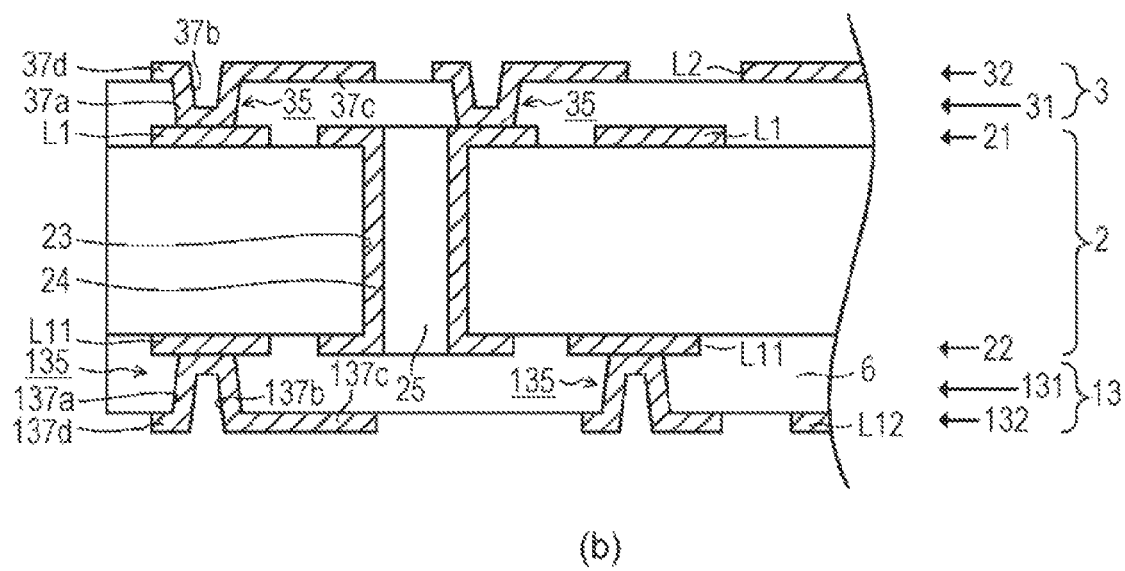
Figure 6:
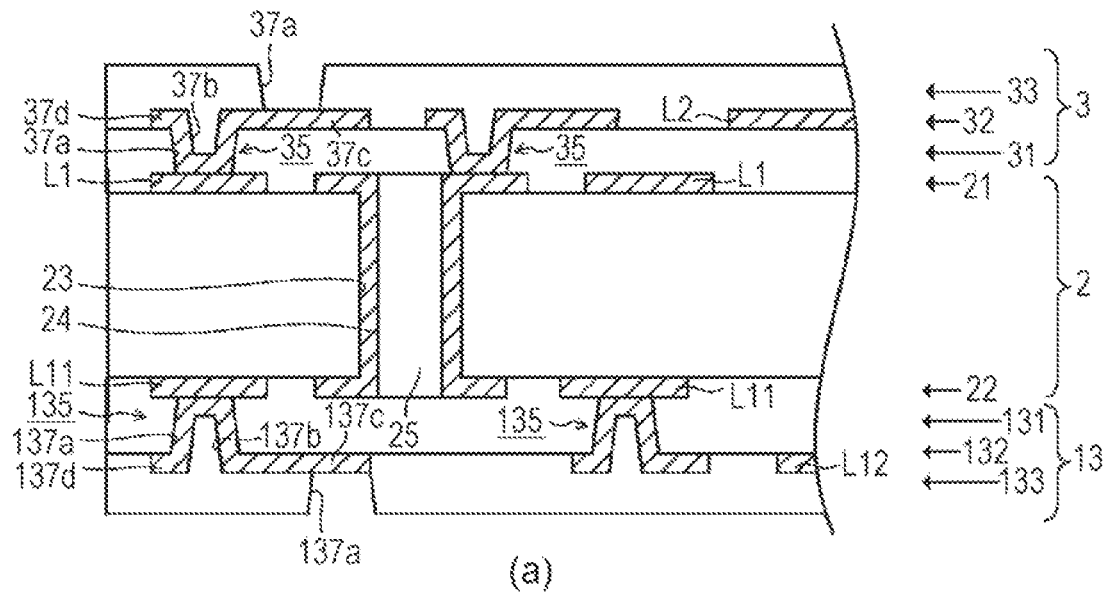
FIG. 6 is a process drawing for fabricating the wiring board according to the first embodiment (build-up process).
Figure 6:
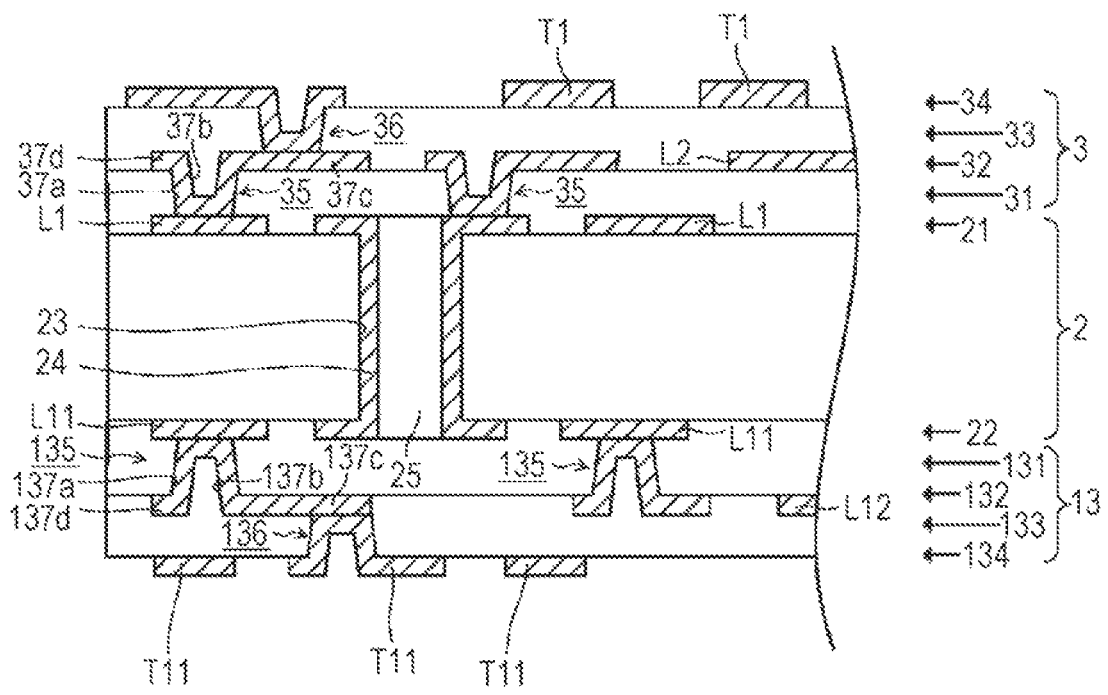

(Build-up Process: FIG. 5 and FIG. 6)

Film insulating resin materials having main constituent of epoxy resin are disposed overlapping with one another on the front face and the reverse surface of the core substrate 2 to form resin insulating layers 31 and 131. Then, this laminated product is pressed and heated with a vacuum thermocompression bonding machine, and the film insulating resin materials are press-bonded with heat hardening. Next, laser irradiation is performed using a conventionally well-known laser processing apparatus to form via holes 37a and 137a at the respective resin insulating layers 31 and 131 (see FIG. 5A).

Subsequently, after roughing the surfaces of the resin insulating layers 31 and 131, electroless copper plating is performed to form electroless copper plating layers on the resin insulating layers 31 and 131 including the inner walls of the via holes 37a and 137a. Next, a photoresist is laminated on the electroless copper plating layers formed on the resin insulating layers 31 and 131 and then is exposed and developed to form a desired-shaped plating resist.

Afterwards, using the plating resist as a mask, the copper is plated by electrolytic plating to obtain a desired copper plating pattern. Next, the plating resist is peeled off and the electroless copper plating layer, which was present under the plating resist, is removed to form the conductor layers 32 and 132 forming the metal lines L2 and L12. In this respect, the vias 35 and 135 formed of the via conductors 37b and 137b, the via pads 37c and 137c, and the via lands 37d and 137d are formed (see FIG. 5b).

Next, film insulating resin materials having main constituent of epoxy resin are disposed overlapping with one another on the conductor layers 32 and 132 to form the resin insulating layers 33 and 133. Then, this laminated product is pressed and heated with a vacuum thermocompression bonding machine, and the film insulating resin materials are press-bonded with heat hardening. Next, laser irradiation is performed using a conventionally well-known laser processing apparatus to form via holes 37a and 137a at the respective resin insulating layers 33 and 133 (see FIG. 6A).

Subsequently, similar to formation of the conductor layers 32 and 132, the conductor layers 34 and 134 with connecting terminals T1 and T11 and the vias 36 and 136 are formed on the respective resin insulating layers 33 and 133 with the via holes 37a and 137a (see FIG. 6B).

Figure 7:
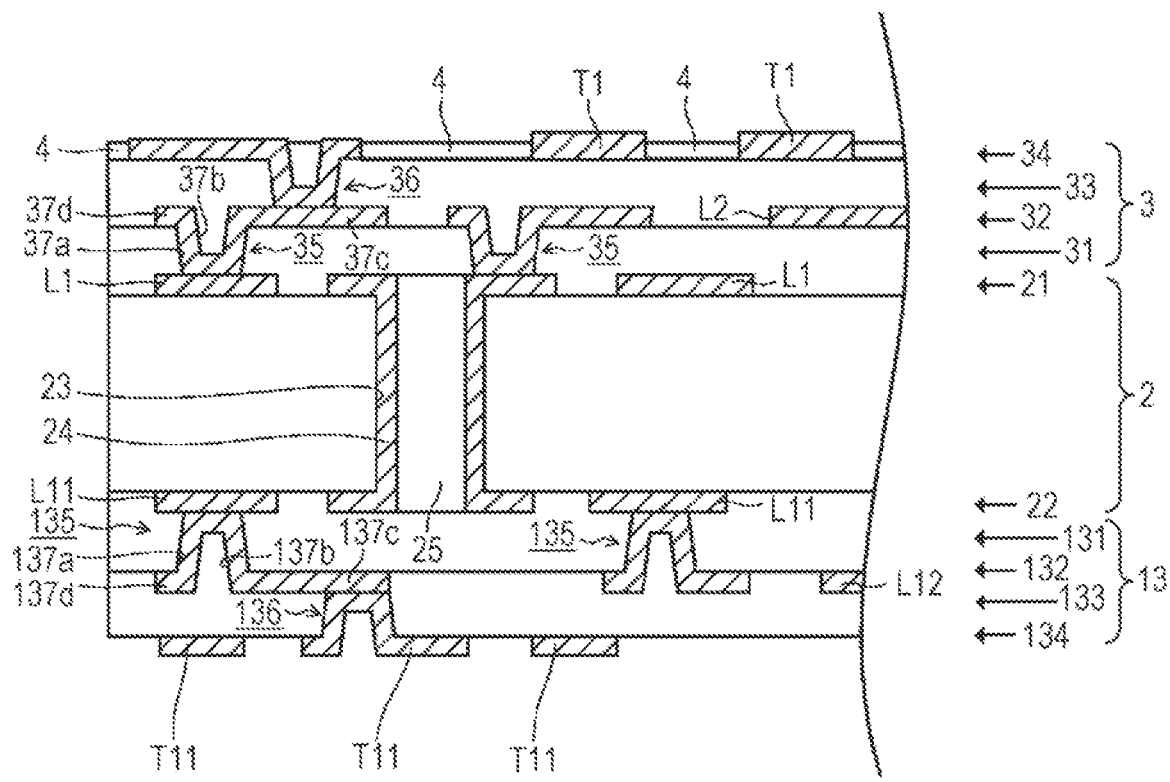
FIG. 7 is a process drawing for fabricating the wiring board according to the first embodiment (filling up process).

(Filling Up Process: FIG. 7)

Next, between the plurality of connecting terminals T1, which form the surface layer of the build-up layer 3, is filled up with the filling member 4 up to the position lower than the connecting terminals T1. To fill up between the connecting terminals T1 with the filling member 4, roughing the surfaces (in particular, side surfaces) of the connecting terminals T1 is preferred. The surfaces of the connecting terminal T1 can be roughed, for example, by processing using etchant, such as MEC Etch Bond (manufactured by MEC Company Ltd.). Instead of roughing the surfaces of each connecting terminals T1, the adhesive property of the filling member 4 may be improved by the following processes. A metal element, any one of Tin (Sn), Titanium (Ti), Chrome (Cr), and Nickel (Ni) is coated on the surface of each connecting terminals T1 to form a metal layer. Then, a coupling agent process is performed on the metal layer.

As a method for filling up the filling member 4 between the connecting terminals T1, various kinds of methods are available. The following describes methods for filling up the filling member 4 between the connecting terminals T1. In the following first to fourth filling up methods, various kinds of methods, such as printing, lamination, roll coat, and spin coat are available as a method for coating the insulating resin, which will be the filling member 4.

(First Filling Up Method)

The first filling up method thinly coats a thermosetting insulating resin on the surface of the build-up layer 3 including the connecting terminal T1 on the surface layer, performs heat hardening, and then polishes the hardened insulating resin until being lower than the connecting terminals T1, thus filling up the filling member 4 between the connecting terminals T1. This polishing roughens the surface H1 of the filling member 4.

(Second Filling Up Method)

The second filling up method thinly coats a thermosetting insulating resin on the surface of the build-up layer 3 including the connecting terminal T1 on the surface layer, removes extra insulating resin covering the top surface of the connecting terminals T1 with solvent that melts the insulating resin, and then performs heat hardening, thus filling up the filling member 4 between the connecting terminals T1. This removal roughens the surface H1 of the filling member 4.

(Third Filling Up Method)

The third filling up method thickly coats a thermosetting insulating resin on the surface of the build-up layer 3 with the connecting terminal T1 on the surface layer, performs heat hardening, masks the region other than the mounting region of the semiconductor device, and then dry-etches the insulating resin by, for example, Reactive Ion Etching (RIE) until being lower than the connecting terminals T1, thus filling up the filling member 4 between the connecting terminals T1. When the filling member 4 is filled up between the connecting terminals T1 by the third filling up method, the filling member 4 and the solder resist layer 5 are integrally formed. This dry etching allows roughening the surface H1 of the filling member 4 and the inner peripheral surface H3 of the opening 5a.
(Fourth Filling Up Method)

Figure 8:
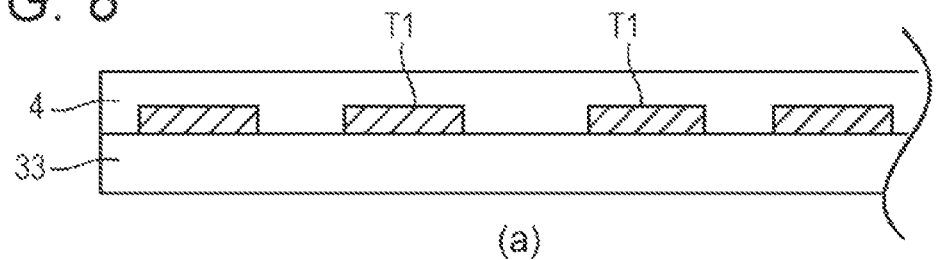
FIG. 8 is an explanatory view of a fourth filling up method.
Figure 8:
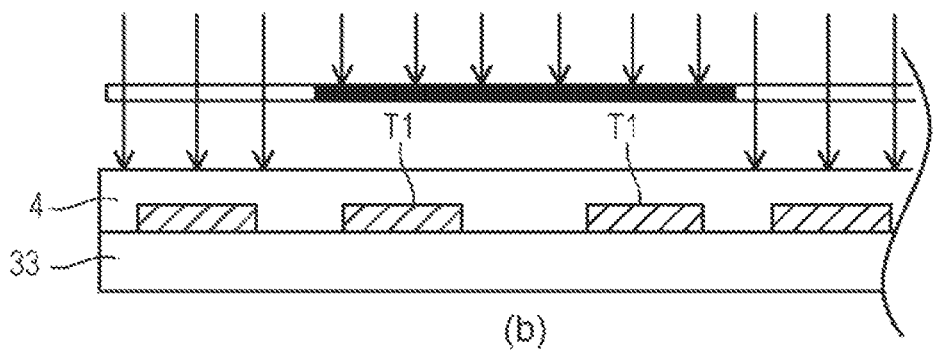
Figure 8:
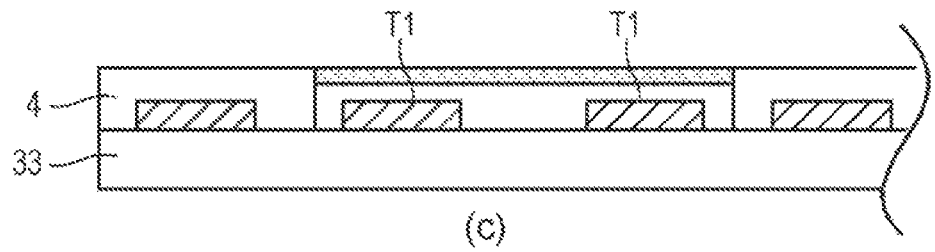
Figure 8:
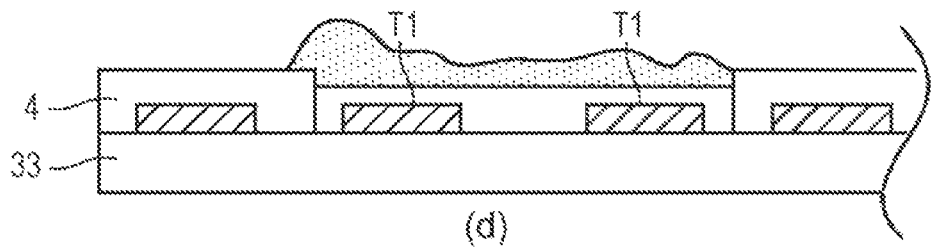
Figure 8:
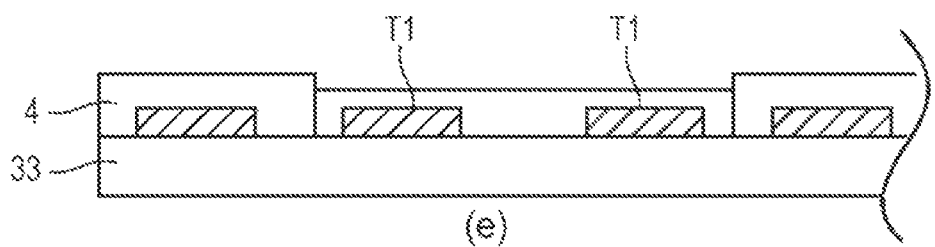
Figure 9:
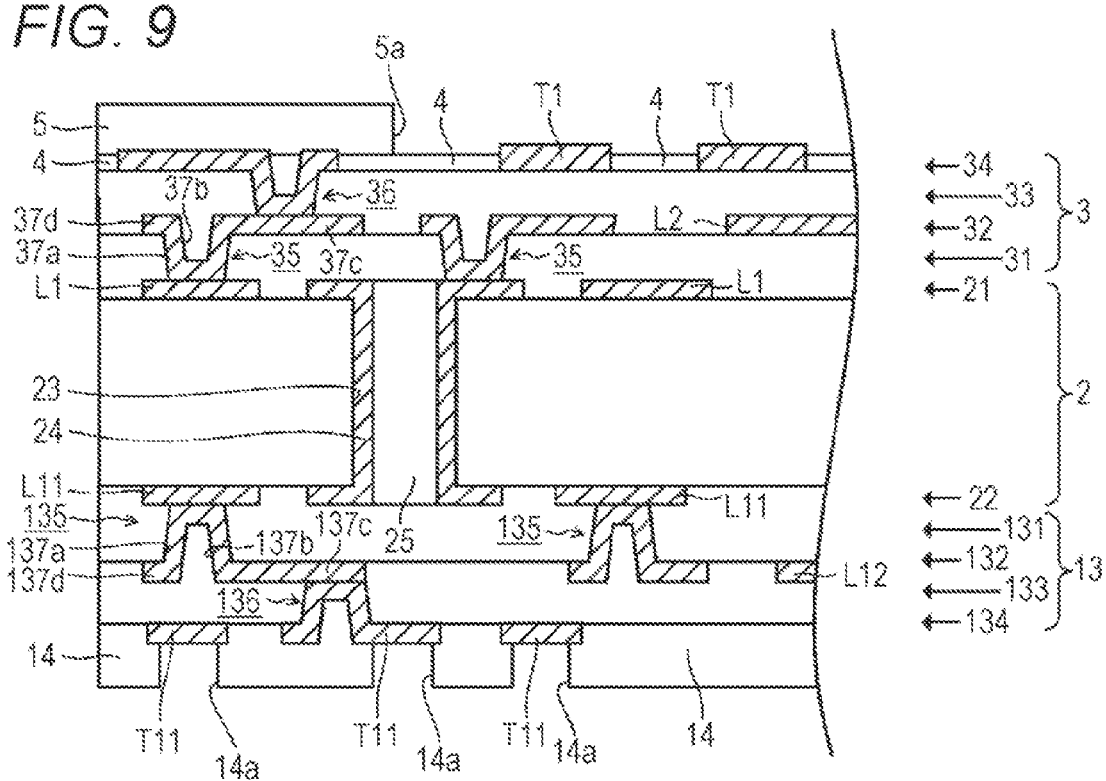
FIG. 9 is a process drawing for fabricating the wiring board according to the first embodiment (solder resist layer process).

FIG. 8 is an explanatory view of a fourth filling up method. The following describes the fourth filling up method with reference to FIG. 8. The fourth filling up method thickly coats a photosensitive insulating resin on the surface of the build-up layer 3 including the connecting terminal T1 on the surface layer (see FIG. 8A), masks the inner region of the region, which will be the opening 5a of the solder resist layer 5 later, and exposes and develops the insulating resin. Thus, the insulating resin, which will be the outer region of the opening 5a, is photo-cured (see FIG. 8B). Next, the wiring board 100 under fabrication is immersed in a sodium carbonate solution (concentration: 1 weight %) for a short period (period to the extent that the insulating-resin surface in the unexposed portion is slightly swelled) (see FIG. 8C). Afterwards, the insulating resin swelled is emulsified by water washing (see FIG. 8D). Next, the swelled and emulsified insulating resin is removed from the wiring board 100 under fabrication (see FIG. 8E). The immersion and the water washing are performed by one time respectively or repeated by several times respectively until the upper end position of the insulating resin that has not been photo-cured is positioned lower than the upper end of each wiring conductor T1. Then, the insulating resin is hardened by heat or ultraviolet rays. When the filling member 4 is filled up between the connecting terminals T1 by the fourth filling up method, the filling member 4 and the solder resist layer 5 are integrally formed. Immersion and water washing allow roughening the surface H1 of the filling member 4 and the inner peripheral surface H3 of the opening 5a.
(Solder Resist Layer Process: FIG. 9)

Figure 10:
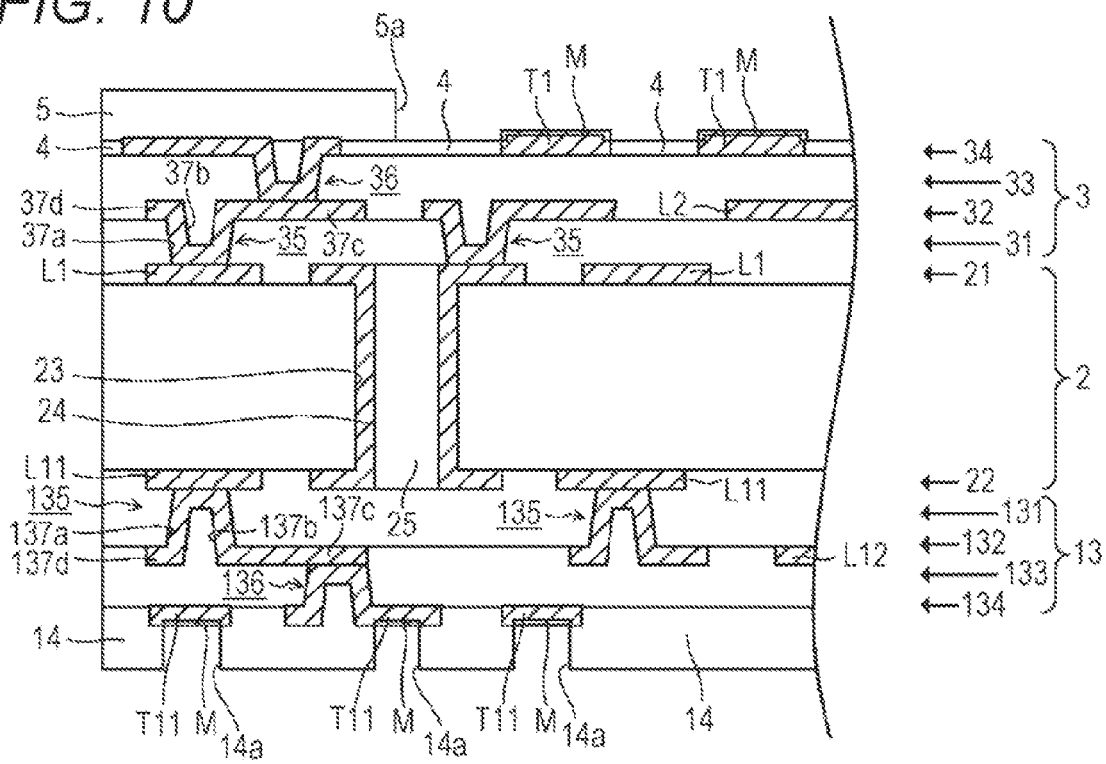
FIG. 10 is a process drawing for fabricating the wiring board according to the first embodiment (plating process).

Film solder resists are pressed and laminated on the surfaces of the filling member 4 and the build-up layer 13. The laminated film-shaped solder resists are exposed and developed to obtain the solder resist layer 5 with the NSMD-shaped opening 5a and the solder resist layer 14 with the SMD-shaped opening 14a. The opening 5a exposes the surface and the side surfaces of each connecting terminal T1 while the opening 14a exposes a part of the surface of each connecting terminal T11. In the case where the above-described first and second filling up method are employed in the filled up process, the inner peripheral surface H3 of the opening 5a of the solder resist layer 5 is roughened (for example, polishing and etching). In the case where the above-described third and fourth filling up methods are employed in the filling up process, since the filling member 4 and the solder resist layer 5 are integrally formed, the solder resist layer 5 is not required to be laminated at the process.
(Plating Process: FIG. 10)

Next, the exposed surface of the connecting terminal T1 is etched using, for example, sodium persulfate to remove impurities, for example, an oxide film on the surface of the connecting terminal T1 and the step L is formed around the principal surface F of the connecting terminal T1. Afterwards, electroless reduction plating using a reducing agent forms the metal plating layers M on the exposed surfaces of the connecting terminals T1 and T11. In the case where the metal plating layer M is formed on the exposed surface of the connecting terminal T1 by the electroless displacement plating, the metal on the exposed surface of the connecting terminal T1 is substituted, thus forming the metal plating layer M. In view of this, even if the exposed surface of the connecting terminal T1 is not etched using, for example, sodium persulfate, the step L is formed around the principal surface F of the connecting terminal T1.

In the case where solder is coated on the exposed surface of the connecting terminal T1, the following two methods can be selected according to the thickness of the solder layer to be coated.
(First Coating Method)

When the solder layer with a thickness of 5 to 30 μm is coated on the exposed surface of the connecting terminal T1, the exposed surface of the connecting terminal T1 is etched little (soft etching) to remove the oxide film formed on the exposed surface of the connecting terminal T1. At this time, the step L is formed around the principal surface F of the connecting terminal T1. Next, a paste (for example, super solder (product name) of Harima Chemicals Group, Inc.) mixed an ionizable compound including a metal, such as Tin (Sn) powder, Ag (silver), and Cu (copper), and a flux is thinly applied over the entire inside of the SMD-shaped opening 14a so as to cover the entire exposed surface of the connecting terminal T1. Afterward, reflow is performed to form a solder layer made of an alloy containing Sn and Ag or Sn, Ag, and Cu on the exposed surface of the connecting terminal T1.
(Second Coating Method)

Figure 11:
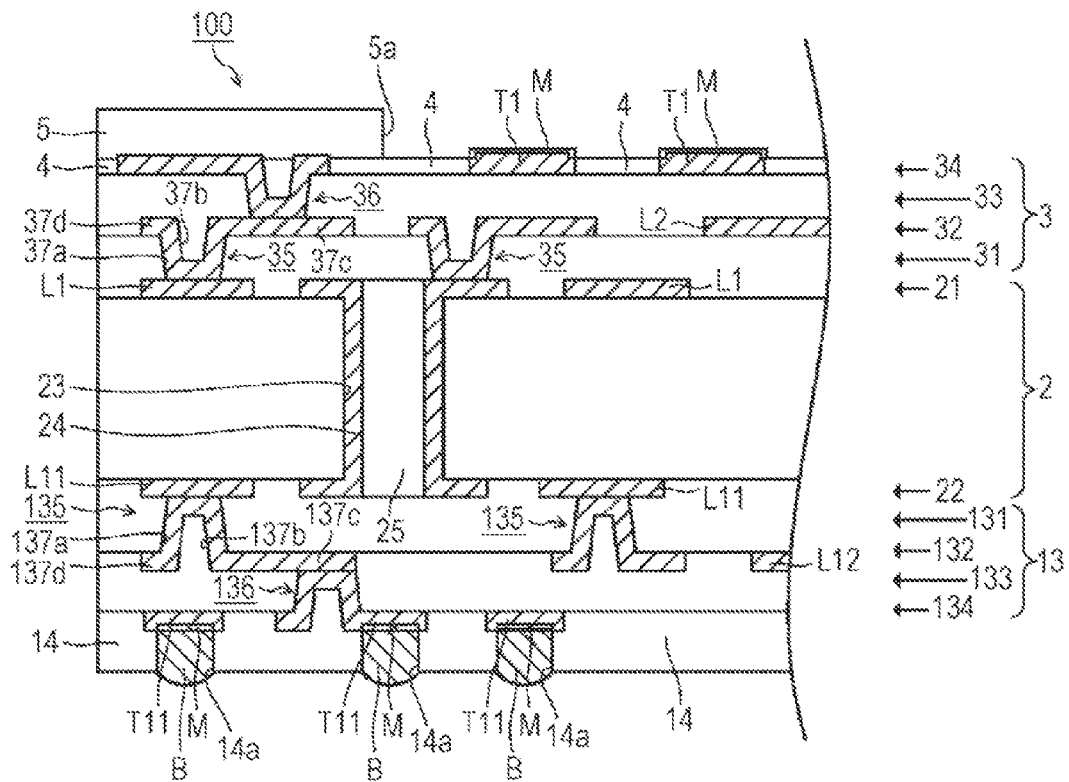
FIG. 11 is a process drawing for fabricating the wiring board according to the first embodiment (back-end process).

When the solder layer with a thickness of equal to or less than 10 μm is coated on the exposed surface of the connecting terminal T1, the exposed surface of the connecting terminal T1 is etched little (soft etching) to remove the oxide film formed at the exposed surface of the connecting terminal T1. At this time, the step L is formed around the principal surface F of the connecting terminal T1. Next, electroless tin (Sn) plating is performed on the exposed surface of the connecting terminal T1 to form an Sn plating layer, and the flux is applied so as to cover the entire surface of the Sn plating layer. Afterwards, a reflow is performed to melt the Sn plating layer plated on the connecting terminal T1 so as to form the solder layer on the principal surface F of the connecting terminal T1. At this time, the melted Sn is condensed to the principal surface F of the connecting terminal T1 by surface tension.
(Back-End Process: FIG. 11)

After the solder paste is applied over the metal plating layer M formed on the connecting terminal T11 by solder printing, a reflow is performed at a predetermined temperature for a predetermined period, thus forming the solder ball B on the connecting terminal T11.

As described above, in the wiring board 100 according to the first embodiment, the surface roughness of the surface H1 of the filling member 4 is rougher than a surface roughness of the top surface H2 (described below) of the solder resist layer 5. In view of this, when connecting the connecting terminal T1 and the semiconductor chip, the flowability of the underfill filled up in the clearance between the semiconductor chip and the wiring board 100 improves. This prevents generation of a void in the underfill between the connecting terminals T1 and also prevents a short circuit between the connecting terminals T1 caused by flow of the solder to the void during reflowing the solder.

The surface roughness of the surface H1 of the filling member 4 is set to a Ra (center line average roughness) of 0.06 μm to 0.8 μm or a Rz (ten-point average roughness) of 1.0 μm to 9.0 μm. This further improves the flowability of the underfill filled up in the clearance between the semiconductor chip and the wiring board 100 when connecting the connecting terminal T1 to the semiconductor chip.

The thickness D1 of the filling member 4 is thinner than a thickness (height) D2 of the connecting terminal T1. That is, the connecting terminal T1 at least partially projects from the surface H1 of the filling member 4. Projecting the connecting terminal T1 from the surface H1 of the filling member 4 facilitates connection with the terminal of the semiconductor chip.

Furthermore, the surface roughness of the top surface H2 of the solder resist layer 5 is equal to or less than a surface roughness of the surface H1 of the filling member 4. Thus, the flowability of the underfill at the top surface H2 of the solder resist layer 5 is lower than a flowability of the underfill at the surface H1 of the filling member 4. This reduces a flow of the underfill from the opening 5a of the solder resist layer 5 to the outside.

The surface roughness of the top surface H2 of the solder resist layer 5 is set to a Ra (center line average roughness) of 0.02 µm to 0.25 µm or a Rz (ten-point average roughness) of 0.6 µm to 5.0 µm. This further reduces the underfill to flow outside from the opening 5a of the solder resist layer 5.

The solder resist layer 5 includes the opening 5a with the inner peripheral surface H3. The inner peripheral surface H3 has a surface roughness rougher than a surface roughness of the top surface H2 of the solder resist layer 5. Setting the surface roughness of the inner peripheral surface H3 of the opening 5a included in the solder resist layer 5 rougher than a surface roughness of the top surface H2 of the solder resist layer 5 improves the flowability of the underfill at the inner peripheral surface H3 of the opening 5a. This efficiently prevents generation of a void that is caused by insufficient flow of the underfill between the surface H1 of the filling member 4 and the inner peripheral surface H3 of the opening 5a.

The surface roughness of the inner peripheral surface H3 of the opening 5a included in the solder resist layer 5 is set to a Ra (center line average roughness) of 0.06 µm to 0.8 µm or a Rz (ten-point average roughness) of 1.0 µm to 9.0 µm. This further efficiently improves the flowability of the underfill at the inner peripheral surface H3 of the opening 5a. This further efficiently prevents generation of a void that is caused by insufficient flow of the underfill between the surface H1 of the filling member 4 and the inner peripheral surface H3 of the opening 5a.

Furthermore, since the step L is formed at the outer periphery of the first principal surface F of the connecting terminal T1 opposed to the surface in contact with the resin insulating layer 33 which constitutes the build-up layer 3. Accordingly, the diameter of the solder coated on the connecting terminal T1 does not increase, thus further narrowing the pitch of the connecting terminals T1. Since the filling member 4 is filled up between the connecting terminals T1 after the contact surface of the connecting terminal T1 with the filling member 4 is roughened, adhesive strength between the connecting terminal T1 and the filling member 4 improves. This suppresses the possibility that the connecting terminal T1 is peeled off during the fabrication process.

(Second Embodiment)

Figure 12:
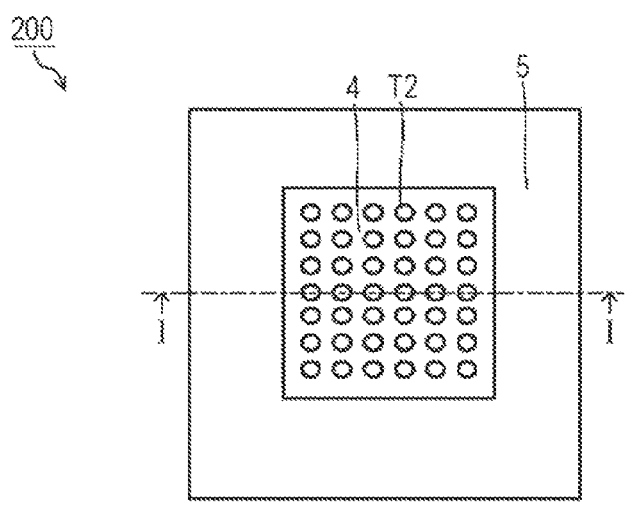
FIG. 12 is a top view (front face side) of a wiring board according to a second embodiment.
Figure 13:
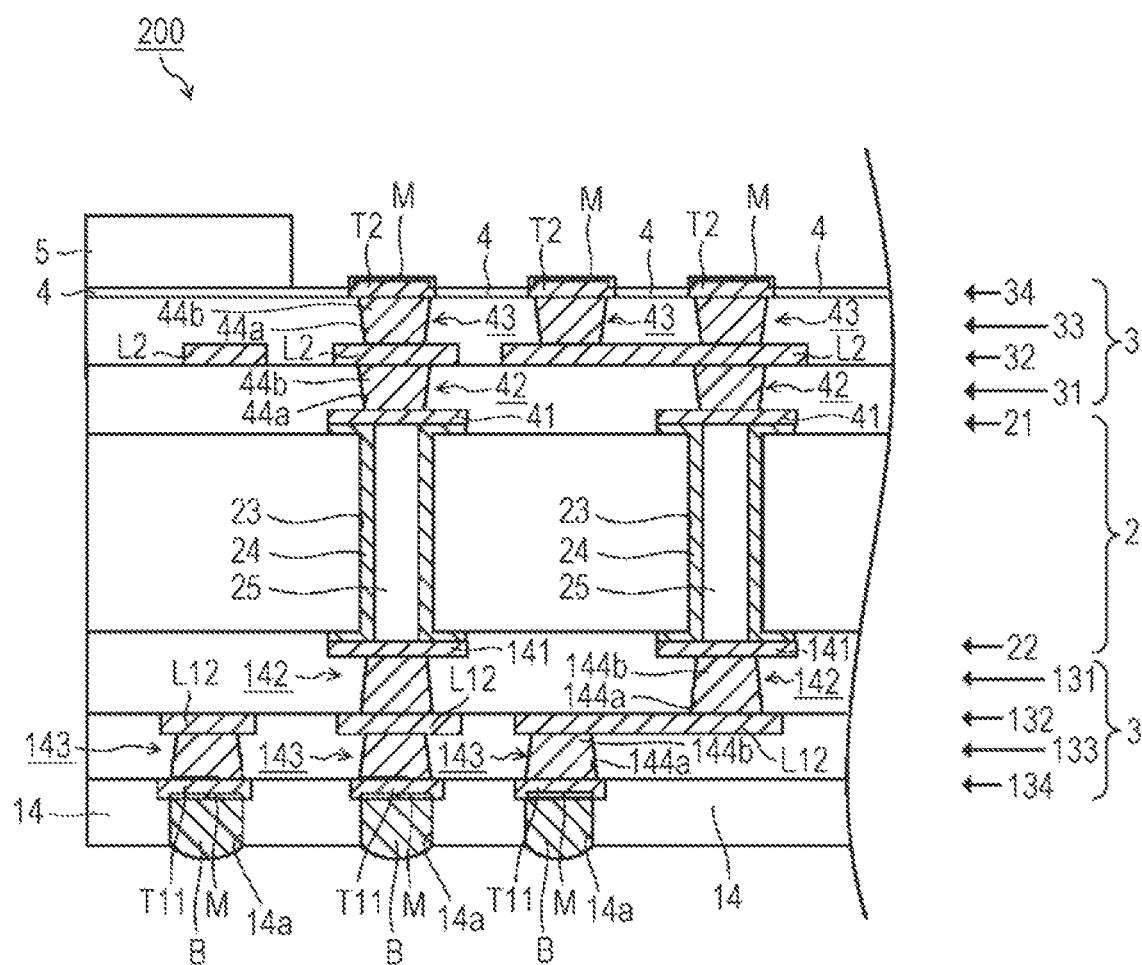
FIG. 13 is a partial sectional view of the wiring board according to the second embodiment.
Figure 14:
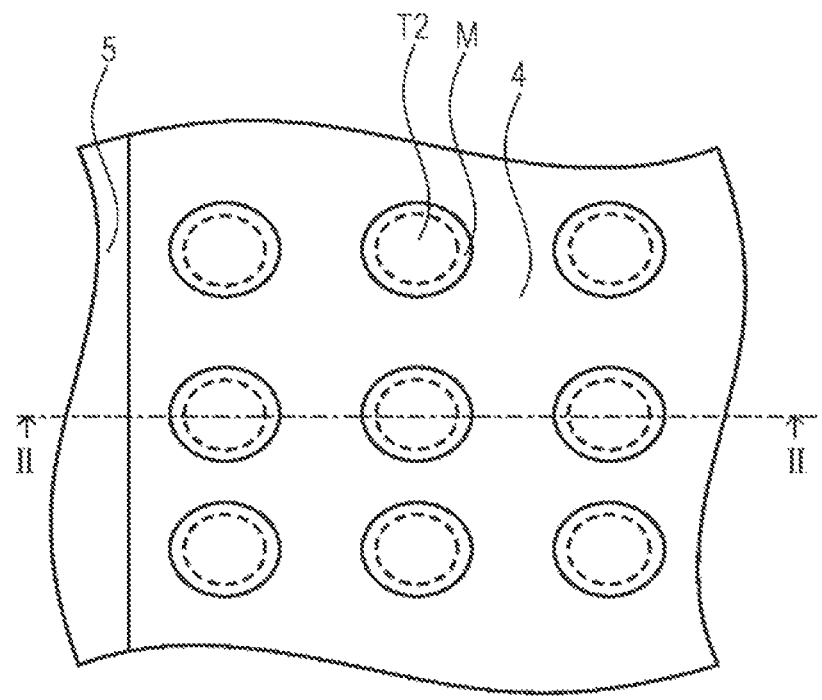
FIG. 14 is a configuration diagram of a connecting terminal on the front face side of the wiring board according to the second embodiment.
Figure 14:
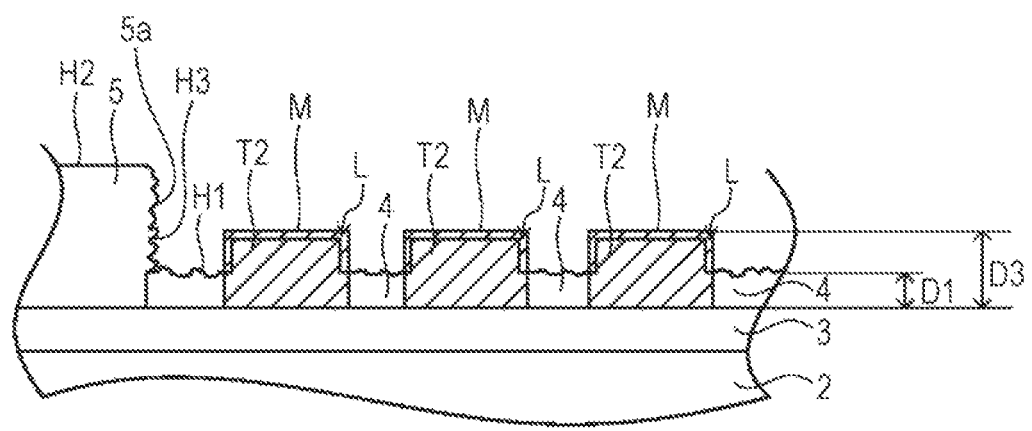

FIG. 12 is a top view (front face side) of the wiring board 200 according to the second embodiment. FIG. 13 is a partial sectional view of the wiring board 200 taken along the line I-I of FIG. 12. FIG. 14 is a configuration diagram of the connecting terminal T2 on the front face side of the wiring board 200. FIG. 14A is a top view of the connecting terminal T2. FIG. 14B is a sectional view taken along the line II-II of FIG. 14A. A configuration of the wiring board 200 will now be described with reference to FIG. 12 to FIG. 14, wherein like reference numerals designate corresponding or identical elements with the wiring board 100 described with reference to FIG. 1 to FIG. 3 throughout the embodiments, and the repeated description will be omitted correspondingly.

(Configuration of Front Face Side)

The wiring board 200 includes a lid plating layer 41 that electrically connects to the core conductor layer 21 on the front face side. The lid plating layer 41 and the conductor layer 32 are electrically connected with a filled via 42 while the conductor layer 32 and the conductor layer 34 are electrically connected with a filled via 43. The filled vias 42 and 43 include a via hole 44a and a via conductor 44b filled up inside of the via hole 44a by plating. The build-up layer 3 includes only a connecting terminal T2 (described later) at the frontmost layer. The build-up layer 3 does not include a wiring pattern connected at the same layer as the connecting terminal T2 and a solder resist layer that covers the wiring pattern. Here, the resin insulating layers 31 and 33 and the conductor layer 32 constitute a laminated body.

The connecting terminal T2 formed on the front face side of the wiring board 200 is a so-called area bump type of connecting terminal disposed on the entire mounting region of the semiconductor chip. The connecting terminal T2 is a connecting terminal with the semiconductor chip. By electrical connection with the connecting terminal T2, the semiconductor chip is mounted on the wiring board 200. Each connecting terminal T2 has a rough surface to improve an adhesive property with the filling member 4. The surfaces of the connecting terminal T2 can be roughened, for example, by processing using etchant, such as MEC Etch Bond (which is manufactured by MEC Company Ltd.).

The connecting terminal T2 includes the step L at an outer periphery of the first principal surface F. The first principal surface F is opposed to a contact surface with the resin insulating layer 33, which constitutes the build-up layer 3. The exposed surface of the connecting terminal T2 including the step L is covered with the metal plating layer M. When mounting the semiconductor chip to the wiring board 200, the connecting terminal of the semiconductor chip and the connecting terminal T2 are electrically connected by reflowing a solder coated on the connecting terminal of the semiconductor chip. Instead of the metal plating layer M, a solder may be coated, or a rustproof OSP process may be performed.

The metal plating layer M is formed on the connecting terminal T2 as follows. The exposed surface of the connecting terminal T2 is etched with, for example, sodium persulfate to form the step L around the principal surface F of the connecting terminal T2. Then, by electroless reduction plating using the reducing agent, the metal plating layer M is formed at the exposed surface of the connecting terminal T2. In the case where the metal plating layer M is formed on the exposed surface of the connecting terminal T2 by the electroless displacement plating, the metal on the exposed surface of the connecting terminal T2 is substituted, thus forming the metal plating layer M. In view of this, even if the exposed surface of the connecting terminal T2 is not etched using, for example, sodium persulfate, the step L is formed around the principal surface F of the connecting terminal T2.

The plurality of connecting terminals T2 of the wiring board 200 projects from the resin insulating layer 33, and the surface and the side surfaces of the connecting terminals T2 are exposed. In view of this, similarly to the connecting terminal T1 of the wiring board 100, between the connecting terminals T2 is filled up with the filling member 4, which is an insulating member. Furthermore, the filling member 4 is filled up between the connecting terminals T2 while closely contacting each side surface of the plurality of connecting terminals T2 formed on the surface layer of the build-up layer 3.

The surface roughness of the surface H1 of the filling member 4 is rougher than a surface roughness of the top surface H2 (described below) of the solder resist layer 5. The surface roughness is a Ra (center line average roughness) of 0.06 µm to 0.8 µm or a Rz (ten-point average roughness) of 1.0 µm to 9.0 µm. Furthermore, the thickness D1 of the filling member 4 is thinner than a thickness (height) D3 of the connecting terminal T2. That is, the connecting terminal T2 at least partially projects from the surface H1 of the filling member 4. The filling member 4 can be filled up between the connecting terminals T2 by the first to the fourth filling up methods described in the first embodiment.

The solder resist layer 5 includes the opening 5*a* that exposes the connecting terminals T2 disposed on the entire mounting region of the semiconductor chip. The opening 5*a* of the solder resist layer 5 has an NSMD shape where the plurality of connecting terminals T2 is disposed in the same opening. Here, the surface roughness of the top surface H2 of the solder resist layer 5 is equal to or less than a surface roughness of the surface H1 of the filling member 4. The surface roughness is a Ra (center line average roughness) of 0.02 µm to 0.25 µm or a Rz (ten-point average roughness) of 0.6 µm to 5.0 µm.

The solder resist layer 5 includes the opening 5*a* with the inner peripheral surface H3. The inner peripheral surface H3 has a surface roughness rougher than a surface roughness of the top surface H2 of the solder resist layer 5. The surface roughness of the inner peripheral surface H3 of the opening 5*a* included in the solder resist layer 5 is preferred to be a Ra (center line average roughness) of 0.06 µm to 0.8 µm or a Rz (ten-point average roughness) of 1.0 µm to 9.0 µm. Setting the surface roughness of the inner peripheral surface H3 of the opening 5*a* included in the solder resist layer 5 to a Ra (center line average roughness) of 0.06 µm to 0.8 µm or a Rz (ten-point average roughness) of 1.0 µm to 9.0 µm further improves the flowability of the underfill at the inner peripheral surface H3 of the opening 5*a*. This further efficiently prevents generation of a void that is caused by insufficient flow of the underfill between the surface H1 of the filling member 4 and the inner peripheral surface H3 of the opening 5*a*.

(Configuration of Reverse Surface Side)

The wiring board 200 includes a lid plating layer 141 that electrically connects to the core conductor layer 22 on the reverse surface side. The lid plating layer 141 and the conductor layer 132 are electrically connected with a filled via 142 while the conductor layer 132 and the conductor layer 134 are electrically connected with a filled via 143. The filled vias 142 and 143 include a via hole 144*a* and a via conductor 144*b* filled up inside of the via hole 144*a* by plating.

The wiring board 200 according to the second embodiment has the same effects as the effects of the wiring board 100 according to the first embodiment.

(Working Example)

The inventors fabricated two wiring boards A and B by the fabrication methods of the wiring board 100 described with reference to FIG. 4 to FIG. 11. The filling member 4 for the wiring board 100 was filled up by the fourth filling up method described with reference to FIG. 8. The wiring board A and the wiring board B differ in that different materials are used for the filling member 4 and the solder resist layer 5. After fabricating the wiring boards A and B, the inventors mounted the semiconductor chips and checked flowability of the underfills.

Figure 16:
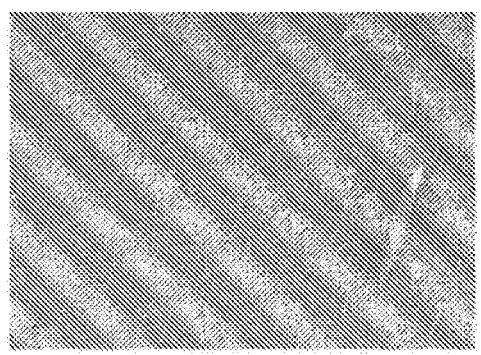
FIG. 16 is an image of the front face of the wiring board according to an embodiment.
Figure 16:
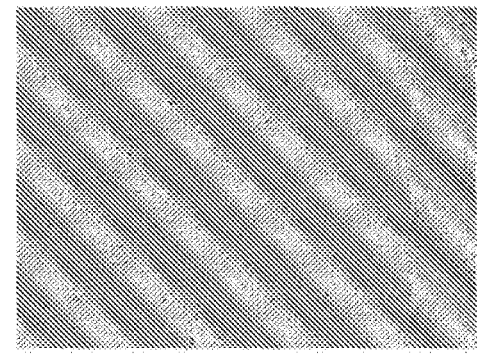

FIG. 16 is an enlarged image of the surface of the wiring board according to the embodiment. FIG. 16A is an enlarged image of the surface H1 of the filling member 4 of the wiring board A. FIG. 16B is an enlarged image of the top surface H2 of the solder resist layer 5 of the wiring board A.

Next, the inventors measured the surface roughness of the fabricated wiring boards A and B. Table 1 shows surface roughness (Ra) of the wiring boards A and B. Table 2 shows surface roughness (Rz) of the wiring boards A and B. Ra and Rz are each averages of values obtained from measurement in 18 points. The following measurement results in Table 1 and Table 2 show that both of the wiring boards A and B have rougher surface roughness (Ra, Rz) of the surface H1 of the filling member 4 than a surface roughness (Ra, Rz) of the top surface H2 of the solder resist layer 5.

TABLE 1

| Wiring board | Measurement position | Number of measurement points | Ra (µm) | Standard deviation ($\sigma$) | Minimum value (µm) | Maximum value (µm) |
| --- | --- | --- | --- | --- | --- | --- |
| A | H1 | 18 | 0.276667 | 0.140168 | 0.06 | 0.44 |
| A | H2 | 18 | 0.038889 | 0.012314 | 0.02 | 0.06 |
| B | H1 | 18 | 0.470000 | 0.134864 | 0.24 | 0.79 |
| B | H2 | 18 | 0.220556 | 0.014742 | 0.19 | 0.26 |

TABLE 2

| Wiring board | Measurement position | Number of measurement points | Rz (µm) | Standard deviation ($\sigma$) | Minimum value (µm) | Maximum value (µm) |
| --- | --- | --- | --- | --- | --- | --- |
| A | H1 | 18 | 1.96833 | 0.84529 | 0.92 | 3.97 |
| A | H2 | 18 | 0.90389 | 0.23200 | 0.62 | 1.53 |
| B | H1 | 18 | 6.06222 | 1.53739 | 3.54 | 8.72 |
| B | H2 | 18 | 3.99278 | 0.83967 | 1.99 | 5.01 |

Next, the inventors mounted the semiconductor chips on the fabricated wiring boards A and B and confirmed that the flowability of the underfills was free of problem. The inventors also confirmed that the underfills did not flow to the outside from the opening 5*a* of the solder resist layer 5.

(Another Embodiment)

Figure 15:
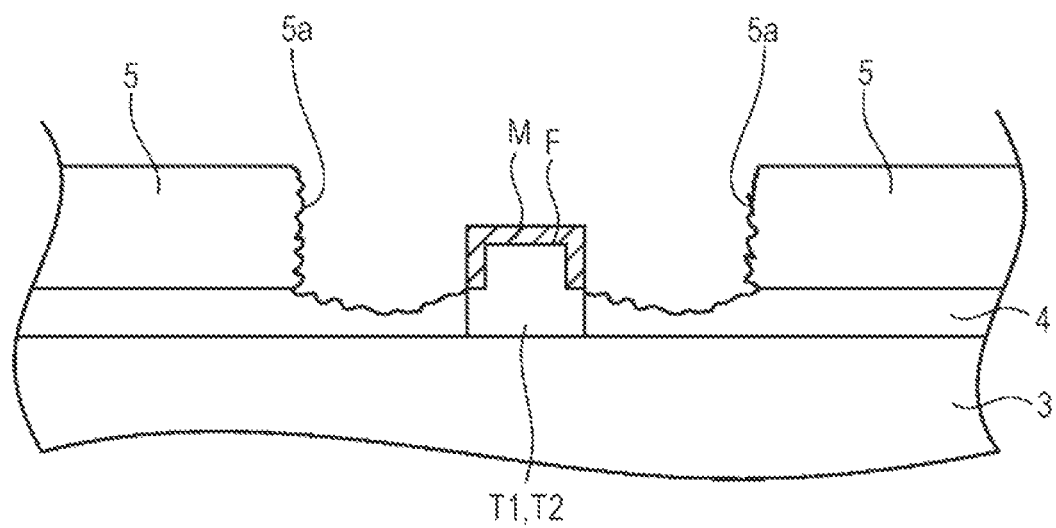
FIG. 15 illustrates a top surface shape of a filling member of the wiring board according to another embodiment.

In the wiring board 100 described with reference to FIG. 1 to FIG. 3 and the wiring board 200 described with reference to FIG. 12 to FIG. 14, the top surfaces of the filling members 4 to be filled up between the respective connecting terminals T1 and T2 are flat. However, the top surface of the filling member 4 is not necessarily to be a flat. A similar effect can be obtained in the case where the filling member 4 forms a so-called fillet shape with a rounded top surface as shown in FIG. 15, for example.

In the wiring board 100 described with reference to FIG. 1 to FIG. 3 and the wiring board 200 described with reference to FIG. 12 to FIG. 14, the filling member 4 and the solder resist layer 5 are made of insulating resin. However, the material forming the filling member 4 and the solder resist layer 5 is not particularly limited. The insulating material where a particulate filler, such as silica, is added to the insulating resin may be used. In the case where the filling member 4 and the solder resist layer 5 are constituted with the insulating material containing a filler, changing a grain size of the filler allows controlling the surface roughness at the surface H1 of the filling member 4 and the inner peripheral surface H3 of the solder resist layer 5 to a desired value easily.

Although the present invention has been described above with reference to the specific embodiments, the present invention is not limited to the above embodiments. Various modification and variation of the embodiments described above will occur without departing from the scope of the present invention. In the above-described specific example, for example, an embodiment where the wiring boards 100 and 200 are BGA substrates that connect to a motherboard or a similar member via the solder ball B is described. However, the wiring boards 100 and 200 may connect to the motherboard or a similar member as a so-called Pin Grid Array (PGA) substrate or a Land Grid Array (LGA) substrate where a pin or a land is disposed instead of the solder ball B.

In this embodiment, in the case where the first filling up method and the second filling up method are employed, the filling member 4 is formed then the solder resist layer 5 is formed. However, the filling member 4 may be formed after formation of the solder resist layer 5.

DESCRIPTION OF REFERENCE SIGNS 100, 200 wiring board
2 core substrate
3 build-up layer
4 filling member
5 solder resist layer
5a opening
13 build-up layer
14 solder resist layer
14a opening
21, 22 core conductor layer
23 through-hole
24 through-hole conductor
25 plug made of resin
31, 33 resin insulating layer
32, 34 conductor layer
35, 36 via
37a via hole
37b via conductor
37c via pad
37d via land
41 lid plating layer
42, 43 filled via
44a via hole
44b via conductor
131, 133 resin insulating layer
132, 134 conductor layer
135, 136 via
137a via hole
137b via conductor
137c via pad
137d via land
141 lid plating layer
142, 143 filled via
144a via hole
144b via conductor
B solder ball
F principal surface
L step
L1, L2 metal line
L11, L12 metal line
M metal plating layer
T1, T2, T11 connecting terminal

The invention claimed is:

1. A wiring board with a laminated body where one or more layer of each of an insulating layer and a conductor layer are laminated, the wiring board comprising:
a plurality of connecting terminals formed separately from one another on the laminated body;
a filling member filled up between the plurality of connecting terminals, the filling member being in contact with at least a part of each side surface of the plurality of connecting terminals; and
a solder resist layer laminated on the laminated body, the solder resist layer including an opening that exposes the plurality of connecting terminals in the same opening, wherein
the filling member has a surface roughness rougher than a surface roughness of a top surface of the solder resist layer.

2. The wiring board according to claim 1, wherein the filling member has a surface roughness (Ra) of 0.06 μm to 0.8 μm.

3. The wiring board according to claim 1, wherein the solder resist layer has a surface roughness (Ra) of 0.02 μm to 0.25 μm.

4. The wiring board according to claim 1, wherein the solder resist layer includes the opening with an inner peripheral surface, the inner peripheral surface having a surface roughness rougher than a surface roughness of the top surface of the solder resist layer.

5. The wiring board according to claim 1, wherein the filling member functions as a solder resist.

6. The wiring board according to claim 1, wherein at least a part of the connecting terminal projects from a surface of the filling member.

* * * * *